US012615764B2

(12) United States Patent
Guo

(10) Patent No.: US 12,615,764 B2
(45) Date of Patent: Apr. 28, 2026

(54) 3D DRAM MEMORY

(71) Applicant: CHANGXIN MEMORY TECHNOLOGIES, INC., Hefei City (CN)

(72) Inventor: Shuai Guo, Hefei City (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 640 days.

(21) Appl. No.: 18/149,724

(22) Filed: Jan. 4, 2023

(65) Prior Publication Data

US 2023/0142435 A1 May 11, 2023

Related U.S. Application Data

(63) Continuation of application No. PCT/CN2022/070291, filed on Jan. 5, 2022.

(30) Foreign Application Priority Data

Mar. 22, 2021 (CN) .......................... 202110304024.6

(51) Int. Cl.
*H10B 12/00* (2023.01)
(52) U.S. Cl.
CPC ......... *H10B 12/482* (2023.02); *H10B 12/033* (2023.02); *H10B 12/05* (2023.02); *H10B 12/315* (2023.02); *H10B 12/488* (2023.02)
(58) Field of Classification Search
CPC .... H10B 12/02–056; H10B 12/30–488; H10B 12/315; H10B 12/033
See application file for complete search history.

(56) References Cited

U.S. PATENT DOCUMENTS 9,000,409 B2 4/2015 Huo et al.
9,070,872 B2 6/2015 Huo et al.
(Continued)

FOREIGN PATENT DOCUMENTS

CN 101673744 A 3/2010
CN 102543877 A 7/2012
(Continued)

OTHER PUBLICATIONS

First Office Action cited in 202110304024.6, mailed Apr. 18, 2022, 22 pages.
(Continued)

*Primary Examiner* — Kevin Parendo
(74) *Attorney, Agent, or Firm* — Kilpatrick Townsend & Stockton LLP

(57) ABSTRACT

Embodiments of the present disclosure provide a semiconductor structure and a manufacturing method thereof, including: a first base, the first base includes a bit line, a transistor, and a first contact structure that are stacked; and a second base, bonded with the first base, the second base includes a second contact structure and a capacitor that are stacked, and the second contact structure is in contact with the first contact structure in an aligned manner; the first contact structure has a first surface facing the second base and a second surface opposite to the first surface, and an area of the first surface is larger than an area of the second surface; and the second contact structure has a third surface facing the first base and a fourth surface opposite to the third surface, and an area of the third surface is larger than an area of the fourth surface.

8 Claims, 9 Drawing Sheets

(56) References Cited

U.S. PATENT DOCUMENTS

| | | | |
|---|---|---|---|
| 11,031,377 B2 | 6/2021 | Liu | |
| 11,177,231 B2 | 11/2021 | Pan et al. | |
| 11,302,706 B2 | 4/2022 | Liu | |
| 11,551,753 B2 | 1/2023 | Liu | |
| 2004/0262635 A1 | 12/2004 | Lee | |
| 2013/0203227 A1* | 8/2013 | Huo | H10D 88/00 |
| | | | 438/238 |
| 2020/0051945 A1* | 2/2020 | Pan | H01L 25/0657 |
| 2020/0328176 A1* | 10/2020 | Liu | H10B 12/50 |
| 2020/0328186 A1* | 10/2020 | Liu | H01L 25/18 |
| 2020/0350014 A1* | 11/2020 | Liu | H01L 21/50 |
| 2020/0350286 A1* | 11/2020 | Cheng | H01L 24/27 |
| 2020/0350287 A1* | 11/2020 | Liu | H10B 61/10 |
| 2020/0350320 A1* | 11/2020 | Cheng | H01L 24/80 |
| 2020/0350321 A1* | 11/2020 | Cheng | H10D 62/83 |
| 2020/0350322 A1* | 11/2020 | Liu | H10B 41/27 |
| 2021/0074709 A1 | 3/2021 | Liu | |
| 2021/0265295 A1* | 8/2021 | Liu | H10B 12/03 |
| 2021/0305259 A1* | 9/2021 | Cheng | H10B 43/40 |

FOREIGN PATENT DOCUMENTS

| | | | |
|---|---|---|---|
| CN | 102544049 A | 7/2012 | |
| CN | 109155301 A | 1/2019 | |
| CN | 110192269 A | 8/2019 | |
| CN | 110249427 A | 9/2019 | |
| CN | 110546762 A | 12/2019 | |
| CN | 111223843 A | 6/2020 | |
| CN | 111357108 A | 6/2020 | |
| CN | 113053900 A | 6/2021 | |

OTHER PUBLICATIONS

Second Office Action cited in 202110304024.6, mailed Jul. 29, 2022, 5 pages.

International Search Report cited in PCT/CN2022/070291 mailed Mar. 29, 2022, 10 pages.

* cited by examiner

3D DRAM MEMORY

CROSS-REFERENCE TO RELATED APPLICATIONS

The present disclosure is a continuation application of International Patent Application No. PCT/CN2022/070291, filed on Jan. 5, 2022, which claims the priority to Chinese Patent Application 202110304024.6, titled "SEMICON-DUCTOR STRUCTURE AND MANUFACTURING METHOD THEREOF" and filed with the China National Intellectual Property Administration (CNIPA) on Mar. 22, 2021. The entire contents of International Patent Application No. PCT/CN2022/070291 and Chinese Patent Application 202110304024.6 are incorporated herein by reference.

TECHNICAL FIELD

The present disclosure relates, but is not limited, to a semiconductor structure and a manufacturing method thereof.

BACKGROUND

A dynamic random access memory (DRAM) in a semiconductor structure is a type of semiconductor memory widely used in computer systems. The main principle of the DRAM is to use the amount of charge stored in the capacitor to represent whether a binary bit is 1 or 0.

However, in order to improve the level of integration of semiconductor integrated circuits, the critical dimension of the DRAM becomes smaller, making the manufacturing process of the DRAM more difficult and the production cycle longer; and the performance of the DRAM needs to be further improved.

SUMMARY

Embodiments of the present disclosure provide a semiconductor structure, including: a first base, where the first base comprises a bit line, a transistor, and a first contact structure that are stacked; and a second base, bonded with the first base, where the second base includes a second contact structure and a capacitor that are stacked, and the second contact structure is in contact with the first contact structure in an aligned manner; the first contact structure has a first surface facing the second base and a second surface opposite to the first surface, and an area of the first surface is larger than an area of the second surface; and the second contact structure has a third surface facing the first base and a fourth surface opposite to the third surface, and an area of the third surface is larger than an area of the fourth surface.

The embodiments of the present disclosure further provide a manufacturing method of a semiconductor structure, including: providing a first base, where the first base includes a bit line, a transistor, and a first contact structure that are stacked; providing a second base, where the second base includes a second contact structure and a capacitor that are stacked; and bonding the first base with the second base, where the first contact structure is in contact with the second contact structure in an aligned manner; the first contact structure has a first surface facing the second base and a second surface opposite to the first surface, and an area of the first surface is larger than an area of the second surface; and the second contact structure has a third surface facing the first base and a fourth surface opposite to the third surface, and an area of the third surface is larger than an area of the fourth surface.

BRIEF DESCRIPTION OF THE DRAWINGS

The drawings incorporated into the specification and constituting a part of the specification illustrate the embodiments of the present application, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

One or more embodiments are exemplified by corresponding accompanying drawings, and these exemplified descriptions do not constitute a limitation on the embodiments. Components with the same reference numerals in the accompanying drawings are denoted as similar components, and the accompanying drawings are not limited by scale unless otherwise specified.

DETAILED DESCRIPTION

As can be learned from the background, the manufacturing process of the DRAM is becoming more difficult and the production cycle is getting longer; the performance of the DRAM also needs to be further improved. Upon analysis, it was found that the main reason is that nowadays, structures such as transistors and capacitors of the DRAM are usually formed sequentially on a substrate; however, as the size of the DRAM keeps shrinking, the process difficulty and the production time keep increasing.

An embodiment of the present disclosure provides a semiconductor structure. The semiconductor structure includes: a first base, and a second base bonded with the first base. The manufacturing process can be performed on the first base and the second base simultaneously, to reduce the production cycle of the product.

In addition, the first contact structure has a first surface facing the second base and a second surface opposite to the first surface, and an area of the first surface is larger than an area of the second surface; the second contact structure has a third surface facing the first base and a fourth surface opposite to the third surface, and an area of the third surface is larger than an area of the fourth surface. In this way, the first contact structure may have a large contact area with the second contact structure, to reduce the contact resistance and the difficulty of alignment, and also prevent an alignment error from negatively affecting the semiconductor structure. Therefore, the embodiment of the present disclosure can improve the projection efficiency, reduce the production difficulty, and improve the performance of the semiconductor structure.

The transistor is a vertical transistor. Compared with a planar transistor, the vertical transistor has higher space utilization in the vertical direction and occupies a smaller area in the horizontal direction, which helps reduce the critical dimension of the semiconductor structure.

The embodiments of the present disclosure are described in detail below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figures 1, 2:
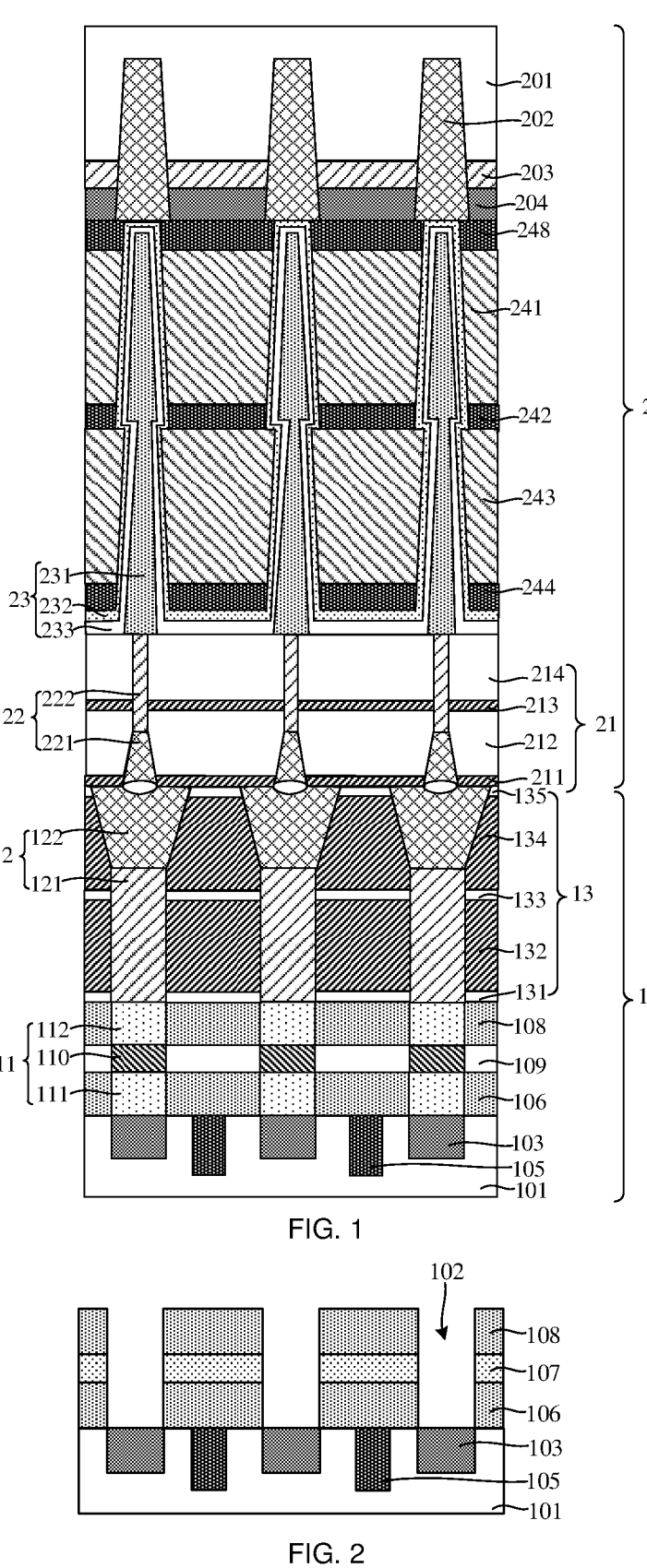
FIG. 1 is a schematic diagram of a semiconductor structure according to an embodiment of the present disclosure.
FIG. 2 is a schematic diagram of a semiconductor structure corresponding to a step of forming isolation structures and bit lines that are alternately arranged in a first substrate in a manufacturing method according to an embodiment of the present disclosure.

An embodiment of the present disclosure provides a semiconductor structure. FIG. 1 is a schematic diagram of a semiconductor structure. Referring to FIG. 1, the semiconductor structure includes: a first base 1 including a bit line 103, a transistor 11, and a first contact structure 12 that are stacked; and a second base 2 bonded with the first base 1, where the second base 2 includes a second contact structure 22 and a capacitor 23 that are stacked, and the second contact structure 22 is in contact with the first contact structure 12 in an aligned manner; the first contact structure 12 has a first surface facing the second base 2 and a second surface opposite to the first surface, and an area of the first surface is larger than an area of the second surface; and the second contact structure 22 has a third surface facing the first base 1 and a fourth surface opposite to the third surface, and an area of the third surface is larger than an area of the fourth surface.

The manufacturing method is specifically analyzed below with reference to the accompanying drawings.

The first base 1 further includes a first substrate 101. In this embodiment, a material of the first substrate 101 may be a semiconductor such as silicon or germanium. In other embodiments, alternatively, the first substrate may be made of an insulating material such as silicon oxide or silicon nitride.

The bit line 103 is located in the first substrate 101, and the first substrate 101 exposes a top surface of the bit line 103. The bit line 103 extends along a first direction. A material of the bit line 103 may be a low-resistance metal such as tungsten, tantalum, gold or silver.

The isolation structure 105 is used to isolate adjacent bit lines 103. The isolation structure 105 is located in the first substrate 101, and the first substrate 101 exposes a top surface of the isolation structure 105. In this embodiment, the isolation structure 105 and the bit line 103 are discrete from each other. In an example, the isolation structure includes a conductive structure such as a conductive metal wire (such as tungsten or ruthenium) or a conductive semiconductor wire (such as polysilicon). The metal wire or semiconductor wire is parallel to the bit line 103, and the metal wire or semiconductor wire may be configured with a constant potential. For example, the metal wire or semiconductor wire is grounded. Adjacent bit lines 103 are isolated by the grounded metal wire or semiconductor wire, to reduce interference between the adjacent bit lines 103, thereby improving device performance.

In this embodiment, the transistor 11 is a vertical transistor. Compared with a planar transistor, the vertical transistor has higher space utilization in the vertical direction and occupies a smaller area in the horizontal direction, which helps reduce the critical dimension of the semiconductor structure. In other embodiments, the transistor 11 may be a planar transistor.

In this embodiment, a plurality of vertical transistors are provided, and the vertical transistors are arranged in an array.

The vertical transistor includes a source 111, a channel region 110, and a drain 112 that are sequentially stacked on the bit line 103. In this embodiment, source 111, both the channel region 110 and the drain 112 are made of silicon; moreover, the source 111 and the drain 112 have a large quantity of dopant ions, where the dopant ions may be boron or phosphorus ions. In other embodiments, the source, the channel region, and the drain may be made of germanium.

A source isolation layer 106 is further provided between adjacent sources 111, and a drain isolation layer 108 is further provided between adjacent drains 112.

The source isolation layer 106 is made of an insulating material such as silicon nitride, silicon oxide, silicon carbide nitride, or silicon oxynitride. The drain isolation layer 108 is made of an insulating material such as silicon nitride, silicon oxide, silicon carbide nitride, or silicon oxynitride.

In this embodiment, the first base 1 further includes: a word line 109, where the word line 109 is connected to the channel region 110. A plurality of word lines 109 are provided, and one word line 109 connects the channel regions 110 of the plurality of vertical transistors.

The word line 109 extends along a second direction, and the first direction is different from the second direction. In this embodiment, the first direction is perpendicular to the second direction. In other embodiments, an angle between the first direction and the second direction may be greater than or equal to 75° and less than 90°.

A material of the word line 109 may be a low-resistance metal such as tungsten, tantalum, gold or silver. A plurality of first contact structures 12 are provided, and the plurality of first contact structures 12 are connected to the plurality of vertical transistors in a one-to-one manner; the drain 112 of the vertical transistor is connected to the first contact structure 12. The first contact structure 12 is connected to the second contact structure 22, such that the first base 1 is bonded with the second base 2. A plurality of second contact structures 22 are provided, and the plurality of second contact structures 22 are connected to the plurality of first contact structures 12 in a one-to-one corresponding manner.

The first contact structure 12 and the second contact structure 22 are specifically described below. The first contact structure 12 has a first surface facing the second base 2 and a second surface opposite to the first surface, and an area of the first surface is larger than an area of the second surface; the second contact structure 22 has a third surface facing the first base 1 and a fourth surface opposite to the third surface, and an area of the third surface is larger than an area of the fourth surface. That is, the first surface and the third surface are bonding surfaces; the second surface and the fourth surface are non-bonding surfaces. Because the bonding surface is larger than the non-bonding surface, the bonding surface has lower contact resistance, and the semiconductor structure has a higher operating speed. The bonding surface with a larger area can reduce the difficulty of alignment between the first base 1 and the second base 2 and can also prevent an alignment error from negatively affecting the semiconductor structure.

The area of the first surface is larger than the area of the third surface. This can avoid that one capacitor 23 is electrically connected to two transistors 11 at the same time when an alignment error occurs.

The area of the first surface is 5 to 20 times the area of the third surface. In an example, the first surface has a length and a width of 40 nm, and an area of 1600 $nm^2$; the third surface has a length and a width of 10 nm, and an area of 100 $nm^2$. A large difference between the areas of the first surface and the third surface can reduce the difficulty of alignment and avoid an incorrect electrical connection. The first contact structure 12 may include a semiconductor conductive layer epitaxially grown on the drain 112, for example, epitaxial silicon or epitaxial germanium. The epitaxially grown semiconductor conductive layer has low contact resistance with the drain. Meanwhile, the first contact structure 12 has a large contact area, which can further reduce the resistance of the first contact structure 12. The second contact structure 22 includes a metal layer electrically connected to the capacitor 23. Because the resistance of the metal layer is lower than that of the semiconductor conductive layer, the third surface of the second contact structure 22 may have a small area, such that the resistance of the first contact structure 12 matches that of the second contact structure 22. For example, the first contact structure 12 and the second contact structure 22 have the same resistance, to improve the device performance.

In this embodiment, the first contact structure 12 and the second contact structure 22 are dual-layer structures. The first contact structure 12 includes a first primary contact structure 121 and a first secondary contact structure 122 that are laminated, where the first primary contact structure 121 is located on a side away from the second base 2, and the first secondary contact structure 122 is located on a side close to the second base 2.

The second contact structure 22 includes a second primary contact structure 221 and a second secondary contact structure 222 that are laminated, where the second primary contact structure 221 is located on a side close to the first base 1, and the second secondary contact structure 222 is located on a side away from the first base 1.

That is, the first primary contact structure 121 is in contact with the transistor 11, the first secondary contact structure 122 is in contact with the second primary contact structure 221, and the second secondary contact structure 222 is in contact with the capacitor 23.

A contact area between the first primary contact structure 121 and the transistor 11 is larger than a contact area between the first secondary contact structure 122 and the second primary contact structure 221, and a contact area between the second secondary contact structure 222 and the capacitor 23 is smaller than the contact area between the first secondary contact structure 122 and the second primary contact structure 221. Such a configuration can not only reduce the resistance of the first contact structure 12 and the on-resistance between transistors 11, but also can reduce the difficulty of alignment and prevent an alignment error from negatively affecting the semiconductor structure. For example, the first primary contact structure 121 may be a semiconductor conductive layer epitaxially grown on the drain 112, for example, epitaxial silicon or epitaxial germanium. The epitaxially grown semiconductor conductive layer has low contact resistance with the drain. The first secondary contact structure 122 and the second contact structure 22 may be metal conductors such as tungsten. The resistance of the first contact structure 12 may match with that of the second contact structure 22. For example, the first contact structure 12 and the second contact structure 22 have the same resistance, to improve device performance.

In a section perpendicular to a surface of the first base 1, a sectional shape of the first primary contact structure 121 is a square, and a sectional shape of the first secondary contact structure 122 is a trapezoid; in a section perpendicular to a surface of the second base 2, a sectional shape of the second secondary contact structure 222 is a square, and a sectional shape of the second primary contact structure 221 is a trapezoid. In other embodiments, the sectional shape of the first primary contact structure may be a trapezoid, and the sectional shape of the first secondary contact structure may be a square; the sectional shape of the second secondary contact structure may be a trapezoid, and the sectional shape of the second primary contact structure may be a square.

Hardness of the first primary contact structure 121 is higher than hardness of the first secondary contact structure 122; a melting point of the first secondary contact structure 122 is lower than a melting point of the first primary contact structure 121. Hardness of the second secondary contact structure 222 is higher than hardness of the second primary contact structure 221; a melting point of the second primary contact structure 221 is lower than a melting point of the second secondary contact structure 222.

When the first primary contact structure 121 and the second secondary contact structure 222 have relatively high hardness, the strength of the semiconductor structure can be improved. When the first secondary contact structure 122 and the second primary contact structure 221 have relatively low melting points, at a low bonding temperature, the first secondary contact structure 122 and the second primary contact structure 221 can be bonded firmly. This can also prevent an excessively high bonding temperature from negatively affecting the semiconductor structure.

The first secondary contact structure 122 and the second primary contact structure 221 may be made of copper, gold or silver. The first primary contact structure 121 and the second secondary contact structure 222 may be made of tungsten or molybdenum.

The first base 1 further includes a first insulating layer 13 for isolating adjacent first contact structures 12. The first insulating layer 13 is a multilayer structure, including a first primary stabilization layer 131, a first primary dielectric layer 132, a first secondary stabilization layer 133, a first secondary dielectric layer 134, and a first tertiary stabilization layer 135 that are laminated.

The first primary stabilization layer 131, the first secondary stabilization layer 133, and the first tertiary stabilization layer 135 are configured to support the first contact structure 12, such that the first contact structure 12 is relatively firm, to avoid problems such as collapsing or tilting.

The first primary stabilization layer 131, the first secondary stabilization layer 133, and the first tertiary stabilization layer 135 are made of a material with high strength, such as silicon nitride.

The first primary dielectric layer 132 and the first secondary dielectric layer 134 are configured to isolate adjacent first contact structures 12, and reduce the parasitic capacitance between adjacent first contact structures 12. Therefore, the first primary dielectric layer 132 and the first secondary dielectric layer 134 are made of a low-K material, such as silicon oxide.

The second base 2 further includes a second insulating layer 21 for isolating adjacent second contact structures 22. The second insulating layer 21 includes a second secondary stabilization layer 211, a second secondary dielectric layer 212, a second primary stabilization layer 213, and a second primary dielectric layer 214 that are laminated.

The second secondary dielectric layer 212 and the second primary dielectric layer 214 can reduce the parasitic capacitance between adjacent second contact structures 22, and therefore are made of a low-K material, such as silicon oxide.

The second secondary stabilization layer 211 and the second primary stabilization layer 213 can support the second contact structure 22, and therefore are made of a material with high strength, such as silicon nitride.

The capacitor 23 is connected to the second contact structure 22. A plurality of capacitors 23 are provided, where the plurality of capacitors 23 are connected to the plurality of second contact structures 22 in a one-to-one corresponding manner. The capacitor 23 is specifically described below.

The capacitor 23 includes a bottom electrode 231, a top electrode 232, and a dielectric layer 233 located between the top electrode 232 and the bottom electrode 231. The bottom electrode 231 is connected to the second contact structure 22. In this embodiment, the top electrodes 232 of the plurality of capacitors 23 are connected, and the dielectric layer 233 of the plurality of capacitors 23 are connected. In other embodiments, alternatively, the top electrodes of the plurality of capacitors may be discrete from each other, and the dielectric layers of the plurality of capacitors may be discrete from each other.

The top electrode 232 may be made of a conductive material, such as titanium or titanium nitride. The bottom electrode 231 may be made of a conductive material, such as titanium or titanium nitride. The dielectric layer 233 may be made of high-k material, such as zirconium oxide, aluminum oxide, or hafnium oxide.

The capacitor 23 includes a first part and a second part, where a joint between the first part and the second part has a corner; the first part includes part of the top electrode 232, part of the bottom electrode 231, and part of the dielectric layer 233; the second part includes part of the top electrode 232, part of the bottom electrode 231, and part of the dielectric layer 233. When the joint between the first part and the second part has a corner, a face-to-face area between the dielectric layer 233 and the top electrode 232 as well as the bottom electrode 231 can be increased, to improve the storage capacity. Moreover, the capacitor 23 with a corner achieves higher stability.

The second base 2 further includes a second support layer 244, a second capacitor isolation layer 243, a first support layer 242, a first capacitor isolation layer 241, and a third support layer 248 that are laminated in a space between adjacent capacitors 23.

The third support layer 248, the second support layer 244, and the first support layer 242 are configured to support the capacitor 23, such that the capacitor 23 is relatively firm, to avoid problems such as collapsing or tilting.

The third support layer 248, the second support layer 244, and the first support layer 242 are made of a material with relatively high strength, such as silicon nitride.

The second capacitor isolation layer 243 and the first capacitor isolation layer 241 are configured to isolate adjacent capacitors 23, and reduce the parasitic capacitance between adjacent capacitors 23. Therefore, the second capacitor isolation layer 243 and the first capacitor isolation layer 241 are made of a low-K material, such as silicon oxide.

The second base 2 further includes: a plurality of discrete electrode pads 202, where the electrode pads 202 are connected to the top electrodes 232 of the capacitors 23 in a one-to-one corresponding manner, and a sectional shape of the electrode pad 202 is a trapezoid. A height of the trapezoid is greater than lengths of parallel sides of the trapezoid. The height of the trapezoid may range from 100 nm to 1500 nm, for example, 500 nm, 800 nm, or 1200 nm. The capacitor 23 is in contact with one parallel side of the trapezoid. The parallel side of the trapezoid is relatively short, that is, the electrode pad 202 occupies a relatively small space in the horizontal direction. Adjacent electrode pads 202 are spaced apart by a relatively large distance, and the electrode pad 202 is deeply embedded into the second substrate 201, which can further improve the stability of the capacitor 23 in the second base 2. The electrode pad 202 may be made of tungsten or molybdenum.

An electrode pad isolation layer 203 and a fourth support layer 204 are further laminated in a space between adjacent electrode pads 202. The electrode pad isolation layer 203 can isolate the electrode pads 202, and the electrode pad isolation layer 203 may be made of silicon oxide. The fourth support layer 204 may support the electrode pad 202, and the fourth support layer 204 may be made of silicon nitride.

In conclusion, because the first base 1 and the second base 2 are two independent structures, the manufacturing process can be performed on the first base 1 and the second base 2 simultaneously, thereby reducing the production cycle of the product. The first contact structure 12 and the second contact structure 22 have a relatively large bonding surface, to reduce the resistance of the bonding surface and the difficulty of alignment, and also prevent an alignment error from negatively affecting the semiconductor structure. Therefore, the embodiment of the present disclosure can improve the projection efficiency, reduce the production difficulty, and improve the performance of the semiconductor structure.

Another embodiment of the present disclosure provides a manufacturing method of a semiconductor structure. FIG. 2 to FIG. 21 are schematic diagrams corresponding to various steps of the manufacturing method of a semiconductor structure according to this embodiment. For the description about the internal materials and shapes of the semiconductor structure, refer to the first embodiment; details are not described herein again.

Referring to FIG. 1, a first base 1 is provided, where the first base includes a bit line 103, a transistor 11, and a first contact structure 12 that are stacked; a second base 2 is provided, where the second base 2 includes a second contact structure 22 and a capacitor 23 that are stacked; and the first base 1 is bonded with the second base 2, where the first contact structure 12 is in contact with the second contact structure 22 in an aligned manner.

Bonding is a physicochemical reaction between atoms at the bonding interface under the action of external energy at a certain temperature and pressure. The first base 1 and the second base 2 are bonded together under the effect of van der Waals and Coulomb forces.

In this embodiment, the bonding is performed at a temperature of 400° C. to 500° C., with a pressure of 20 kN to 60 kN.

When the bonding temperature is within the above range, the atomic diffusion between the first contact structure 12 and the second contact structure 22 can be accelerated, thus enhancing the bonding force between the first contact structure 12 and the second contact structure 22.

When the bonding pressure is within the above range, the bonding strength can be improved.

The first contact structure 12 has a first surface facing the second base 2 and a second surface opposite to the first surface, and an area of the first surface is larger than an area of the second surface; the second contact structure 22 has a third surface facing the first base 1 and a fourth surface opposite to the third surface, and an area of the third surface is larger than an area of the fourth surface.

That is, the first surface and the third surface are bonding surfaces; the second surface and the fourth surface are non-bonding surfaces. Because the bonding surface is larger than the non-bonding surface, the bonding surface has lower contact resistance, and the semiconductor structure has a higher operating speed. The bonding surface with a larger area can reduce the difficulty of alignment between the first base 1 and the second base 2 and can also prevent an alignment error from negatively affecting the semiconductor structure. The bonding surface with a larger area can also improve the strength of bonding.

Steps for forming the first base 1 are described in detail below.

Referring to FIG. 2, a first substrate 101 is provided; alternately arranged isolation structures 105 and bit lines 103 are formed in the first substrate 101, where both the isolation structures 105 and the bit lines 103 extend along a first direction, and the first substrate 101 exposes top surfaces of the bit lines 103 and the isolation structures 105.

In this embodiment, the isolation structures 105 are formed before the bit lines 103 are formed. The isolation structures 105 and the bit lines 103 are formed through the following steps: forming a laminated structure consisting of a silicon oxide layer and a silicon nitride layer on the first substrate 101; forming a patterned photoresist layer on the laminated structure; etching the laminated structure consisting of the silicon oxide layer and the silicon nitride layer as well as the first substrate 101 by using the patterned photoresist layer as a mask, to form isolation structure filling trenches located in the first substrate 101, where the isolation structure filling trenches extend along the first direction; removing the photoresist after forming the isolation structure filling trenches; forming an initial isolation structure in each isolation structure filling trench through chemical vapor deposition, where the initial isolation structure is further located on the laminated structure consisting of silicon oxide and silicon nitride; removing the initial isolation layer located on the laminated structure consisting of silicon oxide and silicon nitride, and removing the silicon nitride layer after partially removing the initial isolation layer; forming a patterned photoresist layer on the silicon oxide layer after removing the silicon nitride layer, and etching the silicon oxide layer by using the patterned photoresist layer as a mask, to expose an upper surface of the first substrate 101; and forming the bit lines 103 in the exposed first substrate 101 through ion implantation.

In other embodiments, alternatively, the bit lines are formed before the isolation structures are formed.

In other embodiments, the isolation structure includes a conductive structure such as a conductive metal wire (such as tungsten or ruthenium) or a conductive semiconductor wire (such as polysilicon). The metal wire or semiconductor wire is parallel to the bit line 103, and the metal wire or semiconductor wire may be configured with a constant potential. For example, the metal wire or semiconductor wire is grounded. Adjacent bit lines 103 are isolated by the grounded metal wire or semiconductor wire, to reduce interference between the adjacent bit lines 103, thereby improving device performance.

Figure 3:
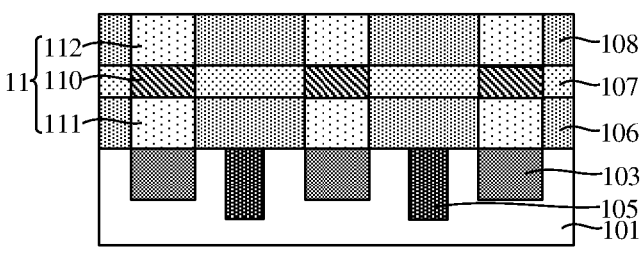
FIG. 3 is a schematic diagram of a semiconductor structure corresponding to a step of forming a transistor on a first substrate in a manufacturing method according to an embodiment of the present disclosure.

Referring to FIG. 2 to FIG. 3, transistors 11 are formed on the first substrate 101, where the transistors 11 are vertical transistors. Referring to FIG. 2, laminated source isolation layer 106, first sacrificial layer 107, and drain isolation layer 108 are formed on the first substrate 101. In this embodiment, the source isolation layer 106, the first sacrificial layer 107, and the drain isolation layer 108 are formed through chemical vapor deposition.

A plurality of third vias 102 penetrating the source isolation layer 106, the first sacrificial layer 107, and the drain isolation layer 108 are formed, where the third via 102 exposes the top surface of the bit line 103. In this embodiment, the third via 102 is formed through dry etching.

Figure 4:
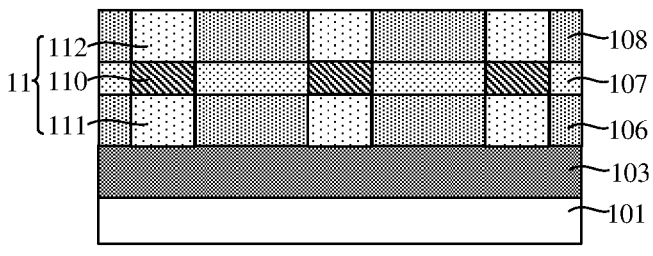
FIG. 4 is a schematic sectional view of FIG. 3 taken along a first direction.

Referring to FIG. 3 to FIG. 4, FIG. 4 is a sectional view of FIG. 3 taken along a first direction. Laminated source 111, channel region 110, and drain 112 are formed in the third via 102, where the source 111, the channel region 110, and the drain 112 form the vertical transistor.

A first semiconductor pillar is formed on the bit line 103 through selective epitaxial growth, where a top surface of the first semiconductor pillar is flush with a top surface of the source isolation layer 106, and ions are implanted into the first semiconductor pillar to form the source 111. A second semiconductor pillar is formed on the source 111 through selective epitaxial growth, where a top surface of the second semiconductor pillar is flush with a top surface of the first sacrificial layer 107, and the second semiconductor pillar serves as the channel region 110. A third semiconductor pillar is formed on the channel region 110 through selective epitaxial growth, and ions are implanted into the third semiconductor pillar to form the drain 112.

In this embodiment, the first semiconductor pillar, the second semiconductor pillar, and the third semiconductor pillar are made of silicon. In other embodiments, alternatively, the first semiconductor pillar, the second semiconductor pillar, and the third semiconductor pillar may be made of germanium. The first semiconductor pillar and the third semiconductor pillar are doped with same ions, for example, boron ions or phosphorus ions.

Figure 5:
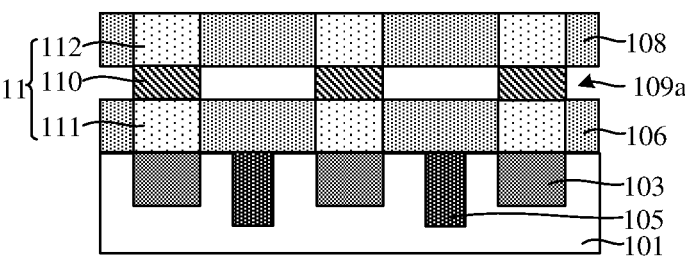
FIG. 5 is a schematic diagram of a semiconductor structure corresponding to a step of forming a first trench in a manufacturing method according to an embodiment of the present disclosure.
Figure 6:
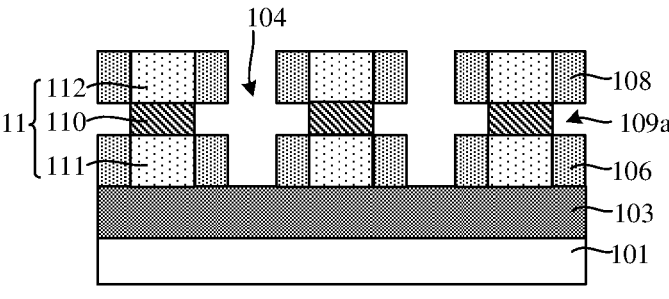
FIG. 6 is a schematic sectional view of FIG. 5 taken along a first direction.

Referring to FIG. 5 to FIG. 6, FIG. 6 is a sectional view of FIG. 5 taken along a first direction. First trenches 104 penetrating the drain isolation layer 108 and the first sacrificial layer 107 (referring to FIG. 4) are formed, where the first trench 104 extends along a second direction, and the second direction is different from the first direction. In this embodiment, the first direction is perpendicular to the second direction. In other embodiments, an angle between the first direction and the second direction may be greater than or equal to 75° and less than 90°.

In this embodiment, the first trench 104 further penetrates the source isolation layer 106. In other embodiments, the first trench may only penetrate the drain isolation layer and the first sacrificial layer.

In this embodiment, the first trenches 104 are formed through dry etching. Before the dry etching, a silicon nitride layer is further formed on the drain isolation layer 108 and the drains 112. During the dry etching, the silicon nitride layer is further partially removed. After the dry etching, the remaining silicon nitride layer is removed. The silicon nitride layer can increase the precision of the etching pattern.

After the first trenches 104 are formed, the first sacrificial layer 107 (referring to FIG. 4) is removed to form word line filling regions 109a. In this embodiment, the first sacrificial layer 107 is removed through wet etching. The word line filling regions 109a are formed at positions originally occupied by the first sacrificial layer 107.

Figure 7:
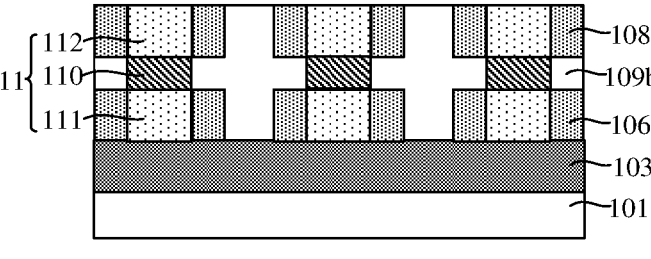
FIG. 7 is a schematic diagram of a semiconductor structure corresponding to a step of forming an initial word line layer that fills up a word line filling region in a manufacturing method according to an embodiment of the present disclosure.

Referring to FIG. 7, an initial word line layer 109b filling up the word line filling regions 109a is formed, where the initial word line layer 109b further fills up the first trenches 104 (referring to FIG. 6). In this embodiment, the initial word line layer 109b is formed through chemical vapor deposition. In other embodiments, the initial word line layer may be formed through physical vapor deposition.

Figure 8:
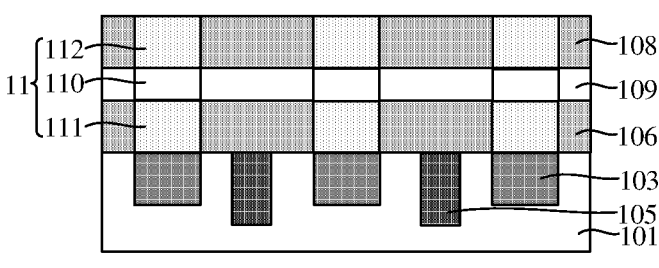
FIG. 8 is a schematic diagram of a semiconductor structure corresponding to a step of partially removing an initial word line layer to form discrete word lines in a manufacturing method according to an embodiment of the present disclosure.
Figure 9:
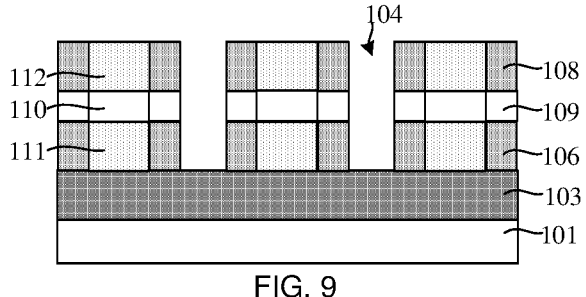
FIG. 9 is a schematic sectional view of FIG. 8 taken along a first direction.

Referring to FIG. 8 to FIG. 9, FIG. 9 is a sectional view of FIG. 8 taken along a first direction. The initial word line layer 109b is partially removed to form word lines 109 that are discrete from each other, and expose the first trenches 104. That is, the remaining initial word line layer 109b serves as the word lines 109, and the first trenches 104 separate the word lines 109. In this embodiment, the initial word line layer 109b is partially removed through dry etching.

Figure 10:
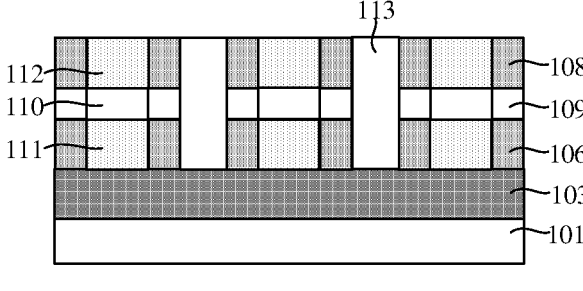
FIG. 10 is a schematic diagram of a semiconductor structure corresponding to a step of forming a word line isolation layer that fills up a first trench in a manufacturing method according to an embodiment of the present disclosure.

Referring to FIG. 10, a word line isolation layer 113 that fills up the first trenches 104 is formed. The word line isolation layer 113 is made of an insulating material such as silicon oxide or silicon nitride, to isolate adjacent word lines 109.

Figure 11:
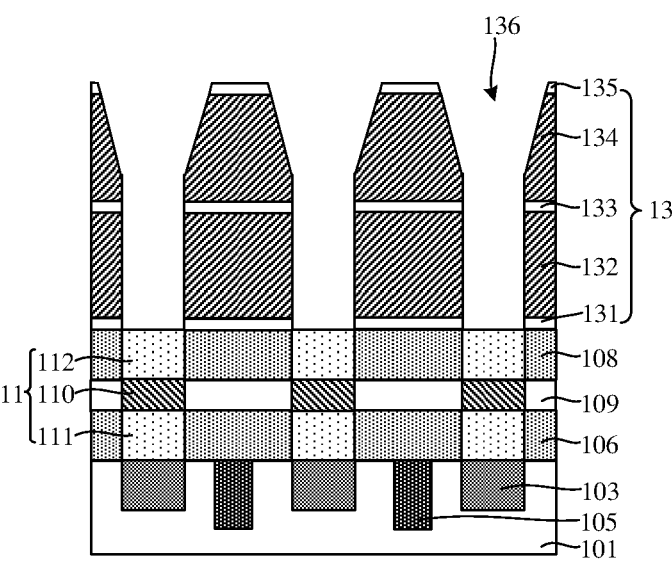
FIG. 11 is a schematic diagram of a semiconductor structure corresponding to a step of forming a first insulating layer on a transistor and forming a first via in a manufacturing method according to an embodiment of the present disclosure.
Figure 12:
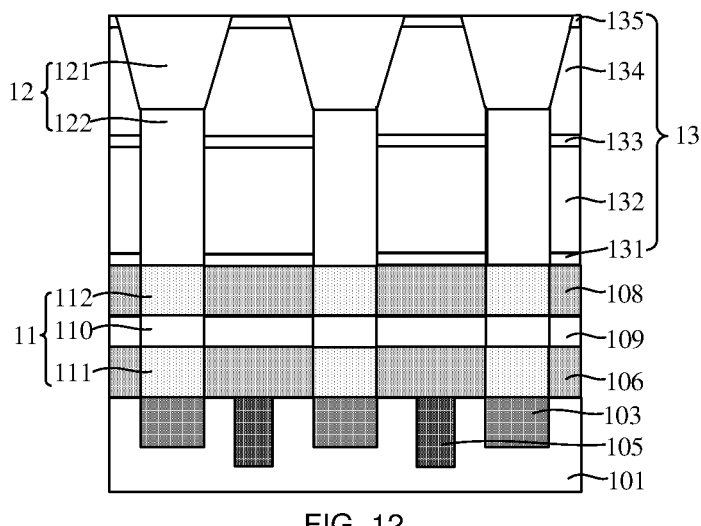
FIG. 12 is a schematic diagram of a semiconductor structure corresponding to a step of forming a first contact structure that fills up a first via in a manufacturing method according to an embodiment of the present disclosure.

Referring to FIG. 11 to FIG. 12, the first contact structure 12 is formed through the following steps: forming a first insulating layer 13 on the transistor 11; forming a first via 136 in the first insulating layer 13; expanding a top of the first via 136, such that are area of the top of the first via 136 is larger than an area of a bottom of the first via 136; and forming the first contact structure 12 that fills up the first via 136.

In this embodiment, the first insulating layer 13 is a multilayer structure. The first via 136 is formed through the following steps: referring to FIG. 11, forming a first primary stabilization layer 131, a first primary dielectric layer 132, a first secondary stabilization layer 133, a first secondary dielectric layer 134, and a first tertiary stabilization layer 135 that are laminated on the drain 112, where the first primary stabilization layer 131, the first primary dielectric layer 132, the first secondary stabilization layer 133, the first secondary dielectric layer 134, and the first tertiary stabilization layer 135 form the first insulating layer 13.

In this embodiment, the first insulating layer 13 is formed through chemical vapor deposition.

The first via 136 penetrating the first primary stabilization layer 131, the first primary dielectric layer 132, the first secondary stabilization layer 133, the first secondary dielectric layer 134, and the first tertiary stabilization layer 135 is formed; the first tertiary stabilization layer 135 and the first secondary dielectric layer 134 are partially removed, such that the area of the top of the first via 136 is larger than the area of the bottom of the first via 136. In this embodiment, the first via 136 is formed through dry etching, and the first via 136 is expanded through dry etching.

Referring to FIG. 12, laminated first secondary contact structure 122 and first primary contact structure 121 are formed in the first via 136 (referring to FIG. 11). In this embodiment, the first secondary contact structure 122 and the first primary contact structure 121 are formed through epitaxial growth and the chemical vapor deposition respectively. In other embodiments, alternatively, the first secondary contact structure and the first primary contact structure may be formed through physical vapor deposition.

Figure 13:
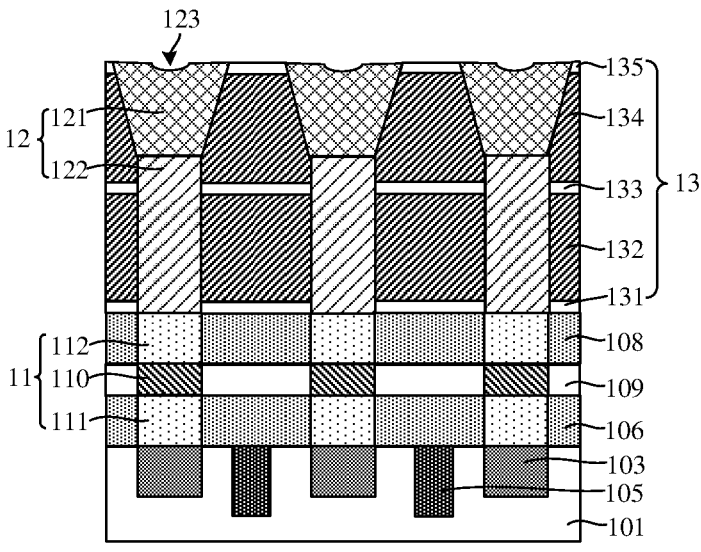
FIG. 13 is a schematic diagram of a semiconductor structure corresponding to a step of forming a first recess portion on a first contact structure in a manufacturing method according to an embodiment of the present disclosure.

Referring to FIG. 13, a first recess portion 123 is formed on a side of the first contact structure 12 that faces the second base 2 (referring to FIG. 1). That is, the first recess portion 123 is formed on a bonding surface of the first primary contact structure 121. During bonding of the first base 1 and the second base 2, there is high stress due to high temperature; in order to reduce the negative impact of the thermal stress on the bonding effect, the first recess portion 123 may be formed. In this embodiment, the first recess portion 123 is formed through chemical-mechanical polishing.

Steps for forming the second base 2 are specifically described below.

Figure 14:
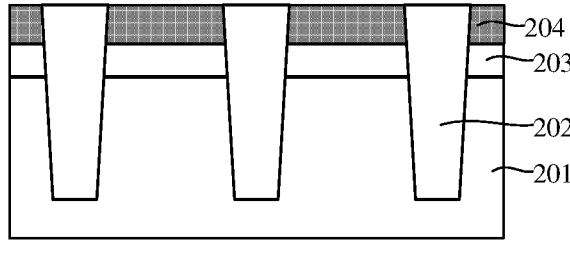
FIG. 14 is a schematic diagram of a semiconductor structure corresponding to a step of forming an electrode pad in a manufacturing method according to an embodiment of the present disclosure.

Referring to FIG. 14, the electrode pad 202 is formed through the following steps: forming an electrode pad isolation layer 203 and a fourth support layer 204 that are laminated on the second substrate 201, and forming a third groove that penetrates the electrode pad isolation layer 203 and the fourth support layer 204, where the third groove is further partially located in the second substrate 201. In this embodiment, the third groove is formed through dry etching.

The electrode pad 202 that fills up the third groove is formed. In this embodiment, the electrode pad 202 is formed through physical vapor deposition. In other embodiments, alternatively, the electrode pad may be formed through chemical vapor deposition.

Figures 15, 16:
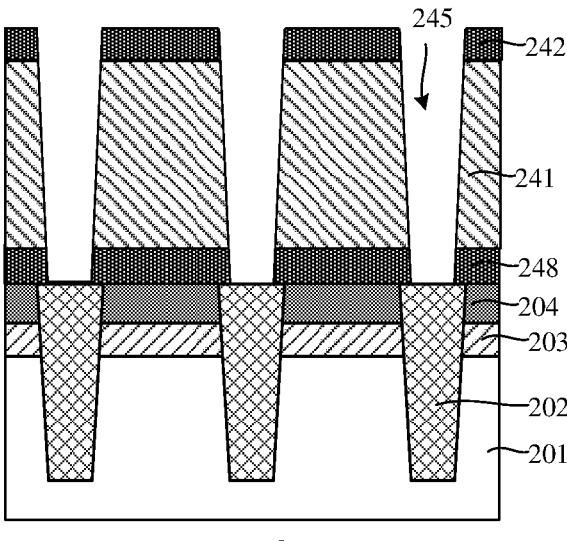
FIG. 15 is a schematic diagram of a semiconductor structure corresponding to a step of forming a third support layer, a first capacitor isolation layer, and a first support layer on a second substrate in a manufacturing method according to an embodiment of the present disclosure.
FIG. 16 is a schematic diagram of a semiconductor structure corresponding to a step of forming a second sacrificial layer that fills up a first groove in a manufacturing method according to an embodiment of the present disclosure.

Referring to FIG. 15 to FIG. 18, the capacitor 23 is formed through the following steps:

Referring to FIG. 15, a second substrate 201 is provided, and laminated third support layer 248, first capacitor isolation layer 241, and first support layer 242 are formed on the second substrate. In this embodiment, the third support layer 248, the first capacitor isolation layer 241, and the first support layer 242 are formed through chemical vapor deposition.

A first groove 245 penetrating the third support layer 248, the first capacitor isolation layer 241, and the first support layer 242 is formed, and a bottom width of the first groove 245 is smaller than an opening width of the first groove 245. In this embodiment, the first groove 245 is formed through dry etching.

Referring to FIG. 16, a second sacrificial layer 246 that fills up the first groove 245 is formed. The second sacrificial layer 246 is made of amorphous silicon.

A second capacitor isolation layer 243 and a second support layer 244 are formed on the first support layer 242 and the second sacrificial layer 246. In this embodiment, the second capacitor isolation layer 243 and the second support layer 244 are formed through chemical vapor deposition.

Figures 17, 18:
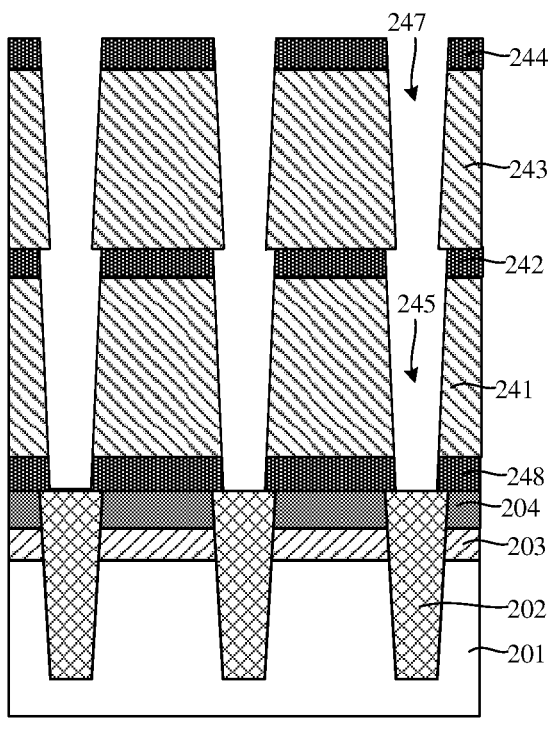
FIG. 17 is a schematic diagram of a semiconductor structure corresponding to a step of forming a second groove that penetrates a second capacitor isolation layer and a second support layer in a manufacturing method according to an embodiment of the present disclosure.
FIG. 18 is a schematic diagram of a semiconductor structure corresponding to a step of forming a capacitor in a first groove and a second groove in a manufacturing method according to an embodiment of the present disclosure.

Referring to FIG. 17, a second groove 247 penetrating the second capacitor isolation layer 243 and the second support layer 244 is formed. The second groove 247 exposes a top surface of the second sacrificial layer 246, and a bottom width of the second groove 247 is smaller than a top width of the second sacrificial layer 246. The second sacrificial layer 246 is removed to expose the first groove 245. In this way, the junction between the first groove 245 and the second groove 247 has a corner.

Referring to FIG. 18, a top electrode 232 is formed on surfaces of the first groove 245 and the second groove 247, where the top electrode 232 further covers the top surface of the second support layer 244. A dielectric layer 233 is formed on a surface of the top electrode 232, a bottom electrode 231 is formed on a surface of the dielectric layer 233, and the bottom electrode 231 located on the second support layer 244 is removed; the bottom electrode 231, the top electrode 232, and the dielectric layer 233 form the capacitor 23.

In this embodiment, the bottom electrode 231 fills up the first groove 245 and the second groove 247. In other embodiments, the bottom electrode may not fill up the first groove and the second groove.

In this embodiment, the first groove 245 and the second groove 247 are formed separately. Compared with the method of forming grooves in one time, the method of forming the grooves in separate steps more easily reduces the line width of the capacitor and the etching difficulty. The combination of two grooves can improve the height of the capacitor, thereby ensuring high storage capacitance. By using the method of forming the grooves in separate steps, the junction between the first groove 245 and the second groove 247 has a corner that can increase the face-to-face area between the dielectric layer 233 and the top electrode 232 as well as the bottom electrode 231, thereby improving the storage capacity and the stability of the capacitor.

Figure 19:
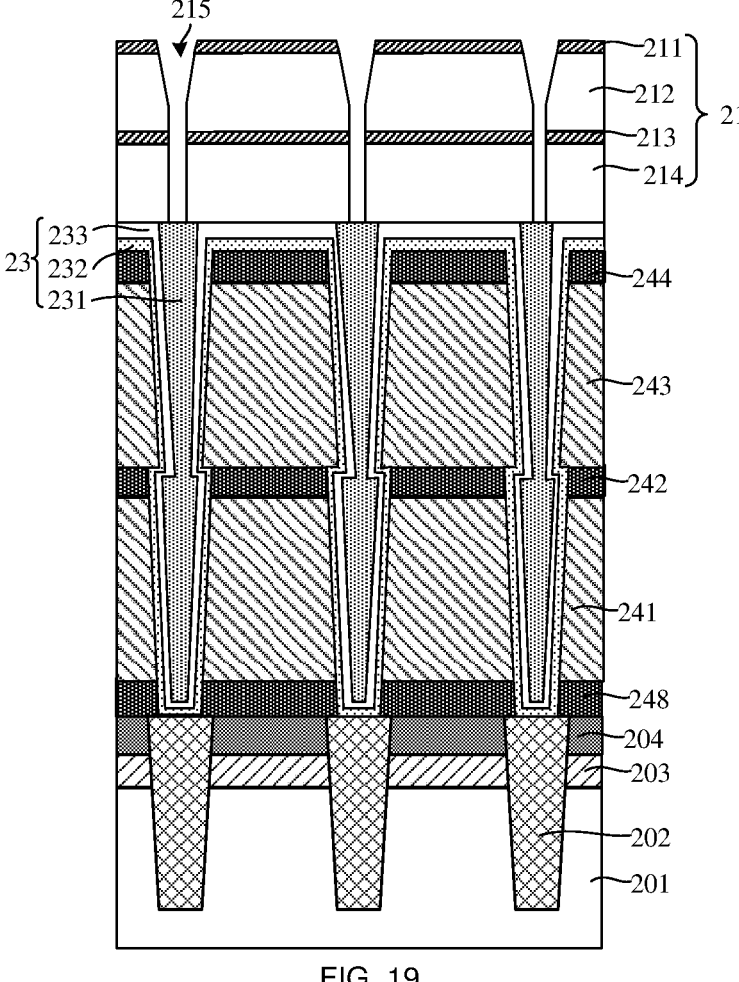
FIG. 19 is a schematic diagram of a semiconductor structure corresponding to a step of forming a second insulating layer on a capacitor and forming a second via in a manufacturing method according to an embodiment of the present disclosure.
Figure 20:
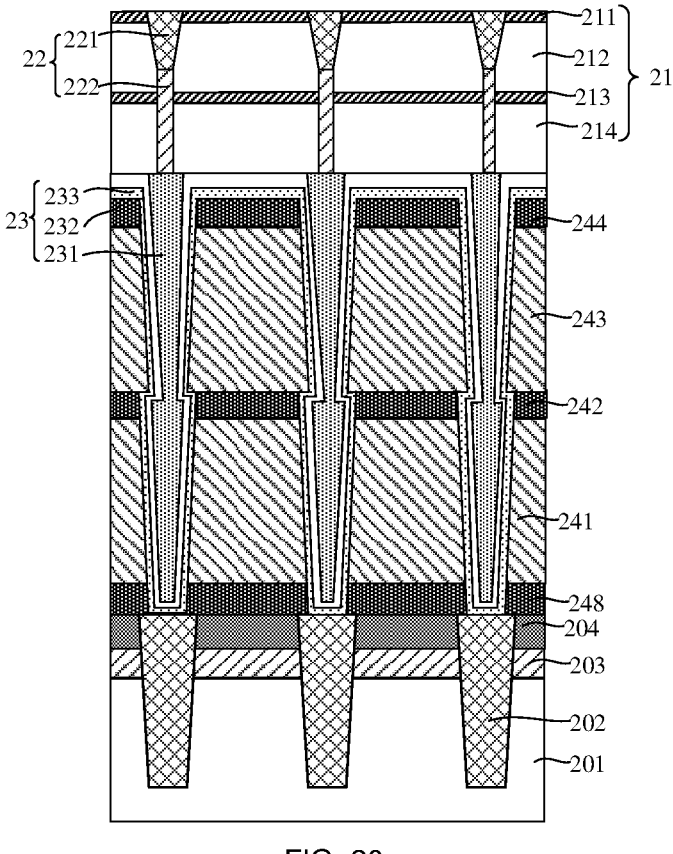
FIG. 20 is a schematic diagram of a semiconductor structure corresponding to a step of forming a second secondary contact structure and a second primary contact structure in a second via in a manufacturing method according to an embodiment of the present disclosure.

Referring to FIG. 19 to FIG. 20, the second contact structure 22 is formed through the following steps: forming a second insulating layer 21 on the capacitor; forming a second via 215 in the second insulating layer 21; expanding a top of the second via 215, such that an area of the top of the second via 215 is larger than an area of a bottom of the second via 215; and forming a second contact structure 22 that fills up the second via 215.

Referring to FIG. 19, laminated second primary dielectric layer 214, second primary stabilization layer 213, second secondary dielectric layer 212, and second secondary stabilization layer 211 are formed on the capacitor 23, where the second primary dielectric layer 214, the second primary stabilization layer 213, the second secondary dielectric layer 212, and the second secondary stabilization layer 211 form the second insulating layer 21. In this embodiment, the second insulating layer 21 is formed through chemical vapor deposition.

The second via 215 penetrating the second primary dielectric layer 214, the second primary stabilization layer 213, the second secondary dielectric layer 212, and the second secondary stabilization layer 211 are formed; the second secondary stabilization layer 211 and the second secondary dielectric layer 212 are partially removed, such that the area of the top of the second via 215 is larger than the area of the bottom of the second via 215.

Referring to FIG. 20, laminated second secondary contact structure 222 and second primary contact structure 221 are formed in the second via 215. In this embodiment, the second secondary contact structure 222 and the second primary contact structure 221 are formed through physical vapor deposition. In other embodiments, alternatively, the second secondary contact structure and the second primary contact structure are formed through chemical vapor deposition.

Figure 21:
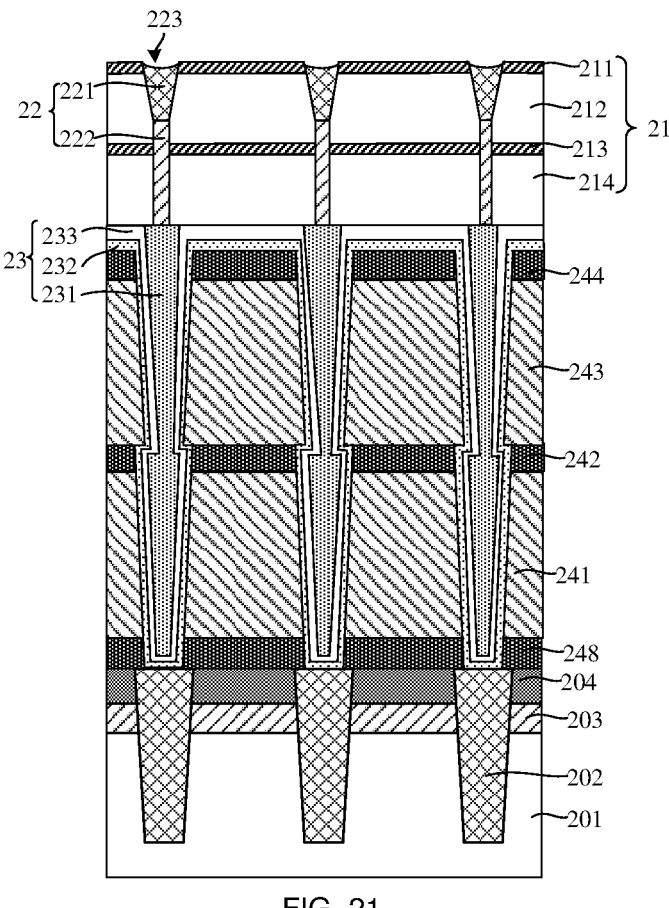
FIG. 21 is a schematic diagram of a semiconductor structure corresponding to a step of forming a second recess portion on a second contact structure in a manufacturing method according to an embodiment of the present disclosure.

Referring to FIG. 21, before the bonding, the manufacturing method further includes: forming a second recess portion 223 on a side of the second contact structure 22 that faces the first base 1. The second recess portion 223 can reduce the negative impact of the thermal stress on the bonding, thereby improving the bonding strength between the second base 2 and the first base 1 and improving the stability of the semiconductor structure. In this embodiment, the second recess portion 223 is formed through chemical-mechanical polishing.

In conclusion, in this embodiment, the manufacturing processes of the first base 1 and the second base 2 may be performed separately, thereby reducing the production cycle. The first contact structure 12 has a relatively large bonding surface with the second contact structure 22, so as to reduce the difficulty of alignment. The first groove 245 and the second groove 247 are formed separately, which more easily reduces the line width of the capacitor and the etching difficulty; the combination of two grooves can improve the height of the capacitor, thereby ensuring high storage capacitance.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

The embodiments of the present disclosure provide a semiconductor structure and a manufacturing method thereof, to reduce the difficulty of the manufacturing process of the DRAM, improve the projection efficiency, reduce the production cycle, improve the performance of the DRAM, and help reduce the critical dimension of the semiconductor structure.

The invention claimed is:

1. A semiconductor structure, comprising:
    a first base, wherein the first base comprises a bit line, a transistor, and a first contact structure that are stacked; and
    a second base, bonded with the first base, wherein the second base comprises a second contact structure and a capacitor that are stacked, and the second contact structure is in contact with the first contact structure in an aligned manner, wherein
    the first contact structure has a first surface facing the second base and a second surface opposite to the first surface, and an area of the first surface is larger than an area of the second surface; and
    the second contact structure has a third surface facing the first base and a fourth surface opposite to the third surface, and an area of the third surface is larger than an area of the fourth surface;
    wherein the transistor is a vertical transistor comprising a source, a channel region, and a drain that are sequentially stacked on the bit line; the drain is connected to the first contact structure; the first base further comprises a word line connected to the channel region; the bit line extends along a first direction, the word line extends along a second direction, and the first direction is different from the second direction.

2. The semiconductor structure according to claim 1, wherein the area of the first surface is larger than the area of the third surface.

3. The semiconductor structure according to claim 2, wherein the area of the first surface is 5 to 20 times the area of the third surface.

4. The semiconductor structure according to claim 1, wherein a plurality of vertical transistors are provided, a plurality of first contact structures are provided, and the plurality of first contact structures are connected to the plurality of vertical transistors in a one-to-one corresponding manner; a plurality of word lines are provided, and one word line connects the channel regions of the plurality of vertical transistors.

5. The semiconductor structure according to claim 1, wherein the capacitor comprises a bottom electrode, a top electrode, and a dielectric layer located between the top electrode and the bottom electrode, and the bottom electrode is connected to the second contact structure.

6. The semiconductor structure according to claim 5, wherein the capacitor comprises a first part and a second part, a joint between the first part and the second part having a corner; the first part comprises part of the top electrode, part of the bottom electrode, and part of the dielectric layer; and the second part comprises part of the top electrode, part of the bottom electrode, and part of the dielectric layer.

7. The semiconductor structure according to claim 5, wherein a plurality of capacitors are provided, a plurality of second contact structures are provided, and the plurality of capacitors are connected to the plurality of second contact structures in a one-to-one corresponding manner; the top electrodes of the plurality of capacitors are connected, and the dielectric layers of the plurality of capacitors are connected.

8. The semiconductor structure according to claim 5, wherein the second base further comprises: a plurality of discrete electrode pads, the electrode pads are connected to the top electrodes of the capacitors in a one-to-one corresponding manner, a sectional shape of the electrode pad is a trapezoid, and a height of the trapezoid is greater than lengths of parallel sides of the trapezoid.

\* \* \* \* \*